(12) United States Patent
Petty

(10) Patent No.: US 6,404,231 B1
(45) Date of Patent: Jun. 11, 2002

(54) METHOD AND APPARATUS FOR ELECTRICALLY COUPLING DIGITAL DEVICES

(75) Inventor: John S. Petty, Chapel Hill, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/252,008

(22) Filed: Feb. 16, 1999

(51) Int. Cl.[7] .................. H03K 19/0175; H02J 1/10
(52) U.S. Cl. ................ 326/80; 323/273; 307/18
(58) Field of Search ................ 326/80, 81; 327/538, 327/545; 323/282, 283, 273, 274, 303; 307/18, 90

(56) References Cited

U.S. PATENT DOCUMENTS 5,298,807 A * 3/1994 Salmon et al. ............... 326/68
5,440,520 A * 8/1995 Schutz et al. ............... 365/226
5,552,698 A * 9/1996 Tai et al. ..................... 323/313
5,689,179 A * 11/1997 Walker ........................ 323/283

FOREIGN PATENT DOCUMENTS

WO      WO87003759    *  6/1987  .................. 326/80

* cited by examiner

Primary Examiner—Michael Tokar
Assistant Examiner—James H. Cho
(74) Attorney, Agent, or Firm—Coats & Bennett, P.L.L.C.

(57) ABSTRACT

Apparatus for electrically coupling a first digital device (408) and a second digital device (406) includes an interface circuit at the first digital device coupled at an interface node (230) to the second digital device. The interface circuit is configured to provide a first device supply voltage (Vcc2) to the interface node until a second device supply voltage (Vcc) at the interface node exceeds the first voltage. A data circuit (220) at the first digital device is coupled to the interface node. The data circuit is responsive to voltage on the interface node for providing digital logic signals at appropriate voltage levels to the second digital device.

12 Claims, 3 Drawing Sheets

METHOD AND APPARATUS FOR ELECTRICALLY COUPLING DIGITAL DEVICES

BACKGROUND OF THE INVENTION

The present invention is generally related to communication of digital data. More particularly, the present invention is related to communication of digital data among digital devices having different operating voltages.

Digital devices employ families of integrated circuits to operate on digital data and provide logical functions and operations. However, digital devices that must communicate may operate at different operating voltages. For example, some well-known logic families operate at a nominal voltage of 5.0 volts. Other logic families operate at nominal supply voltages of 3.3 volts or 1.8 volts. Some systems use combinations of more than one of these logic families.

When data is communicated among digital devices operating at different operating voltages, some transformation must be made to ensure reliable communication. The voltages generated by one device and corresponding to digital logic levels may be inappropriate for the input of another device. For example, a 1.8 volt supply device will have an output logic one level of approximately 1.8 volts. This may not be sufficient to be detected as a logic one at the input of a 5 volt supply device, which expects a logic one to have a value closer to 5.0 volts.

One accommodation for this problem is to provide pull-up resistors at the inputs of the 5 volt logic. If the voltage provided to the input is only driven to, for example, 1.8 or 3.3 volts, the pull-up resistor will pull the voltage to a value close to 5.0 volts to ensure accurate input level protection. However, pull-up resistors introduce a risk of latch-up, have poor noise immunity and reduced peak operating speed and increase overall current drain.

Another solution involves designing a cable that connects a 5 volt device and a lower voltage device such as a 3.3 volt device. The cable includes an active voltage conversion circuit for shifting input and output voltages. Such a cable tends to be an expensive alternative, however. The cable must be custom made for the application and must include the components of the active circuit.

Accordingly, there is a need for a method in apparatus for communicating digital data among devices having different operating voltages.

BRIEF SUMMARY OF THE INVENTION

By way of introduction only, in one embodiment, a method for communicating digital data between digital devices provides a voltage tolerant, digital input/output interface. The interface is implemented by varying the supply voltage of a logic family at one end of a connection to match the logic voltage used at the other end of the connection. In the preferred embodiment, the supply voltage is provided by a voltage regulator that tolerates an overvoltage condition on its output.

The foregoing description has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
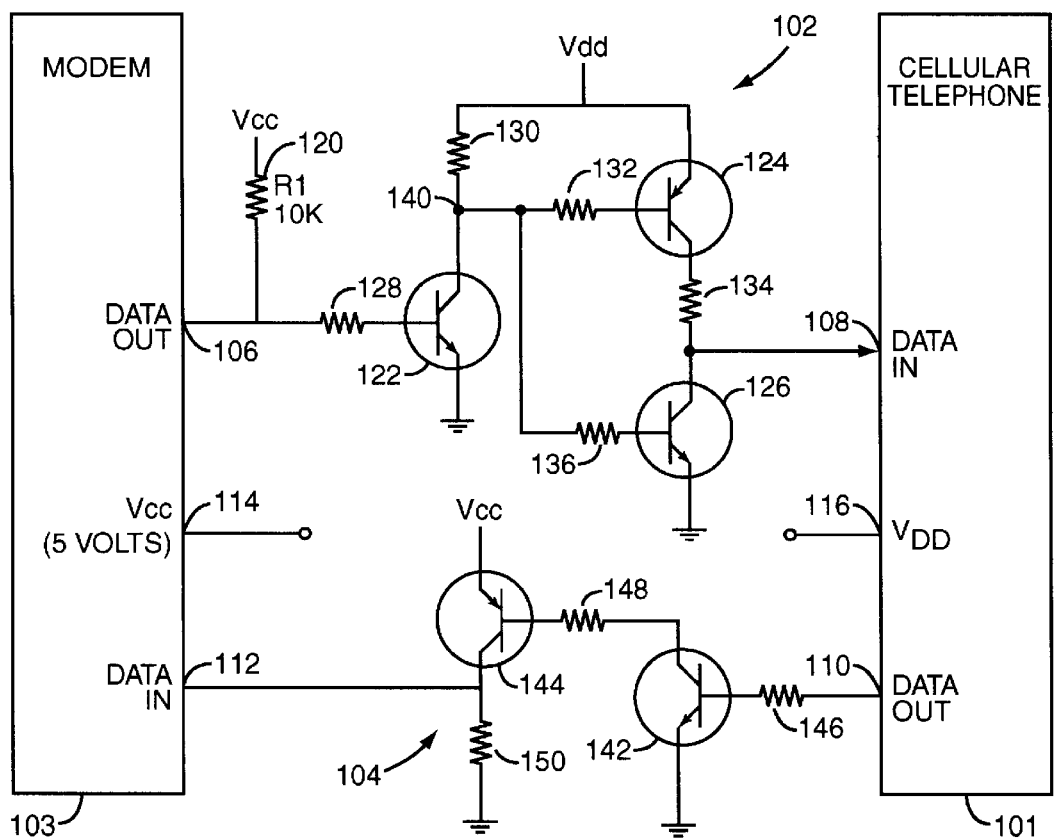
FIG. 1 is a circuit diagram of a circuit for communicating data among digital devices having different operating voltages.

Referring now to FIG. 1, it shows a circuit diagram of a circuit 100 for communicating data among digital devices having different operating voltages. The circuit 100 is typically embodied in a cable which connects to digital devices. In the illustrated embodiment, the two digital devices are a cellular telephone 101 and a cellular modem 103. The cellular telephone 101 provides wireless communication with a remote location. The cellular modem 103 provides data communication between the cellular telephone 101 and another digital device, such as a personal computer. The components of the circuit 100 are typically embodied as one or more integrated circuits contained within a plastic connector at the end or ends of the cable.

The circuit 100 includes a data transmission circuit 102 and a data reception circuit 104. The data transmission circuit 102 communicates digital data received at a pin 106 at one end of the cable to a pin 108 at the other end of the cable. Similarly, the data reception circuit 104 communicates data received at a pin 110 at one end of the cable to a pin 112 at the other end of the cable.

The circuit 100 is configured for electrically coupling two digital devices which have differing operating voltages. In the illustrated embodiment, the modem operates at 5 volt logic levels and the cellular telephone operates using either 3.3 or 5 volt logic levels. In FIG. 1, the modem power supply is designated Vcc and is nominally 5 volts. The cellular telephone power supply is designated Vdd and is nominally 3.3 volts. The circuit 100 receives Vcc at a pin 114 and Vdd at a pin 116. The circuit 100 uses these voltages in the data transmission circuit 102 and the data reception circuit 104. Not all connections are shown in FIG. 1 so as to not unduly complicate the drawing figure.

The data transmission circuit 102 includes a pull-up resistor 120, a first transistor 122, a second transistor 124 and a third transistor 126. The data transmission circuit 102 also includes a resistor 128, a resistor 130, a resistor 132, a resistor 134 and a resistor 136. Digital data are received at the pin 106 and provided to the data transmission circuit 102. The digital data typically has one of two voltage values. A first voltage value is approximately Vcc and corresponds to a logic one. A second voltage value is approximately ground and corresponds to a logic zero. When a logic one signal is provided to the input pin 106, the voltage level Vcc turns on the transistor 122. The collector of this transistor, at node 140, is then pulled to a value near ground. This causes the PNP transistor 124 to turn on and the transistor 126 to turn off so that the output of the data transmission circuit 122, at pin 108, is pulled to a value near Vdd or 3.3 volts. When a logic zero is applied to the input 106, the voltage near ground turns off the transistor 122. Current supply to the resistor 130 pulls node 140 to Vdd, turning off transistor 124 and turning on transistor 126. As a result, a voltage near ground corresponding to logic zero is provided to the pin 108. The pull-up resistor 120 improves the drive capability of the output circuit from the modem.

The data reception circuit 104 includes a transistor 142 and a transistor 144, along with a resistor 146, a resistor 148, and a resistor 150. When a logic one is received at pin 110 from the cellular telephone, the logic one has a value of approximately Vdd or 3.3 volts. This voltage is sufficient to turn on the transistor 142, drawing current from the base of the transistor 144, thereby turning on the transistor 144. When the transistor 144 is turned on, the output of the data reception circuit 104 at pin 112 is pulled to a value near Vcc, corresponding to a logic one value. Similarly, a logic zero value is received at the pin 110 has a voltage near ground. This voltage turns off the transistor 142 so that no base current is provided to the transistor 144, turning off the transistor 144. The resistor 150 pulls the output of the data reception circuit 104, at pin 112, to ground corresponding to a logic zero value.

The circuit 100 is suitable for use in applications where both Vdd and Vcc are equal to 5 volts. Both the data transmission circuit 102 and the data reception circuit 104 operate similarly when Vdd is at 5 volts as when Vdd is at 3.3 volts. Thus, a cable or other interface circuit using the circuit 100 may be used to couple two digital devices such as a modem and a cellular telephone using both 3.3 and 5 volt supply voltages.

However, a cable constructed using the circuit 100 is relatively expensive. The components of the circuit 100 must be fabricated small enough to fit into a plastic connector at one end of the cable. Also, a custom cable must be used, rather than a generic, off-the-shelf type cable which does not include the voltage transformation circuit, circuit 100. Also, the circuit 100 is relatively slow because the transistors used therein, when turned on, enter the saturation region of operation. Saturation is a relatively low speed, high power mode of operation. For low cost and high speed performance, an alternative to the circuit 100 may be preferred.

Figure 2:
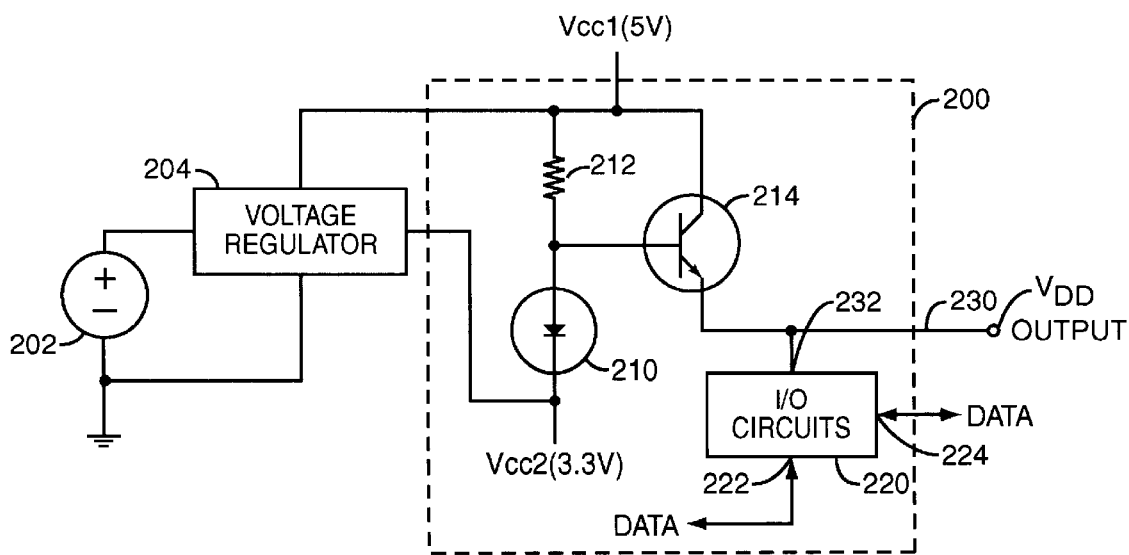
FIG. 2 is a first circuit in accordance with the present invention for communicating data among digital devices.

FIG. 2 illustrates a circuit 200 for communicating data among digital devices having differing operating voltages in accordance with the present invention. In the illustrated embodiment, the circuit 200 is contained completely inside a device such as a cellular telephone and has only a single connection, terminal 224, for external connection to another digital device. Terminal 224 may serve as an input, an output or a bi-directional terminal. The circuit 200 further has an internal terminal 222 which is coupled to other circuitry inside the digital device. Thus, the circuit 200 permits the communication of digital data from internal to the digital device at terminal 222 to another external digital device coupled to the terminal 224.

In the illustrated embodiment, the circuit 200 is included in a cellular telephone which further includes a battery 202 for providing operating power to the cellular telephone and a voltage regulator 204 which provides regulated voltages for operating different circuitry of the cellular telephone. Two exemplary voltages produced by the voltage regulator are 5 volts, designated Vcc1 in FIG. 2, and 3.3 volts, designated Vcc2.

The circuit 200 includes a diode 210, a resistor 212 and a transistor 214. The resistor 212 is coupled between Vcc1 and the base of the transistor 214. The diode 210 has an anode coupled to the base of the transistor 214 and a cathode coupled to Vcc2. The transistor 214 has a collector coupled to Vcc1 and an emitter coupled to an interface node 230 labeled Vdd.

The circuit 200 further includes one or more input/output (I/O) circuits 220. As illustrated, an I/O circuit 220 has a terminal 222 for communicating data with the first digital device, such as a cellular telephone, and a second terminal 224 for communicating data with a second digital device, such as a cellular modem. The I/O circuit is thus bi-directional. Other I/O circuit embodiments may be unidirectional, serving as only an input or an output. The circuit 200 may include any suitable number of I/O circuits 220. For example, if data is communicated serially, a single I/O circuit 220 is required. However, if digital data is transmitted in parallel, multiple I/O circuits 220 will be required. The I/O circuit 220 thus forms a data circuit for data interchange with a second digital device, such as a cellular modem.

The diode 210, resistor 212 and transistor 214 form an interface circuit which generates a first device supply voltage at a first digital device containing the circuit 200, such as a cellular telephone. The voltage drop across the diode 212 will be approximately equal to the voltage drop across the base-emitter junction of the transistor 214. Thus, the voltage on the interface node 230 will be approximately equal to Vcc2, or 3.3 volts in the illustrated embodiment.

The diode 210 and the transistor 214 form a voltage regulator having an output coupled to the interface node 230 and configured to provide a regulated voltage to the output node as a supply voltage. In the circuit 200, the output voltage is regulated or compensated against variations in Vcc1. In other applications, it may be necessary or desirable to compensate the output voltage against variations in temperature. Suitable voltage regulators may be implemented by those ordinarily skilled in the art.

The interface node 230 is configured to be coupled to a second digital device which communicates digital data with a first digital device, including the circuit 200. The interface node 230 provides an operating voltage for input/output circuits of the second digital device which communicate with I/O circuit 220. Similarly, the interface node 230 is coupled to a terminal 232 of the I/O circuits 220 to provide an operating voltage for the I/O circuits. Thus, data communication circuits at both the first digital device and the second digital device operate using the same operating voltage or supply voltage, Vdd, conveyed on the interface node 230.

The circuit 200 operates by generating a first device supply voltage at a first digital device, such as the cellular phone containing the circuit 200. The circuit 200 then varies the first device supply voltage to match a logic voltage used by logic circuits at a second digital device in communication with the first digital device. The second digital device may be, in one example, a cellular modem. The first device supply voltage is provided at interface node 230, labelled Vdd. This voltage is used to power input and output circuits used for data interchange at both the first digital device and the second digital device, which are assumed to have a common ground connection. Thus the circuit 200 produces logic levels in the I/O circuit 220 and varies the logic levels in response to varying the first device supply voltage. Since both digital devices use the same supply voltage, the logic levels or voltages, which are referenced to the supply voltage, will be the same, too, and the digital devices can communicate reliably.

The supply voltage is provided at an interface node 230 coupled to the second digital device until a second device supply voltage, generated at the second digital device and provided to the interface node, exceeds the supply voltage. Thus, input and output circuits at the first digital device and the second digital device will operate on the first device supply voltage so long as it is greater than the second device supply voltage. As soon as the second device supply voltage exceeds the first device supply voltage, the input and output circuits of both digital devices will operate on the second device supply voltage. In the context of the embodiment illustrated in FIG. 2, a voltage approximately equal to Vcc2 is provided to the interface node 230 until a second device supply voltage at the interface node exceeds Vcc2. If Vcc2 is 3.3 volts and a 5 volt circuit is attached to the interface node 230, the greater voltage will prevail. The emitter follower transistor 214 will become reverse biased and the interface circuit will be inactivated.

Transistor 214 is configured as an emitter follower to provide adequate current drive to supply operating current to both the I/O circuits 220 of the circuit 200 and input/output circuits of the second digital device. As an emitter follower, transistor 214 operates as an active mode device. Thus, the transistor 214 is coupled to the interface node 230 for providing drive current to the interface node at the first device supply voltage. The transistor is substantially turned off when the second device supply voltage at the interface node 230 exceeds the first device supply voltage. Vcc1 is illustrated in FIG. 2 as 5 volts but could be in the range, for example, of 4 to 9 volts. Vcc2 is the logic voltage used in the cellular telephone which includes the circuit 200, 3.3 volts in the illustrated example. Resistor 212 has a value selected to provide sufficient current to the diode 210 and to the base of the transistor 214 to forward bias the diode 210 and provide enough emitter current for I/O circuits 220. Preferably, the circuit 200 is designed so that the base-emitter drop of the transistor 214 is the same as the voltage drop across the diode 210. If that condition is maintained, the emitter voltage of the transistor 214 is normally very close to Vcc2.

If the second digital device, such as an external modem, requires a higher logic level, the second digital device simply connects the desired supply voltage to the interface node 230. In this situation, with Vdd higher than Vcc2, the base-emitter junction of the transistor 214 becomes reverse biased and operates in cut-off mode. In this situation, the emitter current drops to substantially zero. The supply voltage to the I/O circuits 220 of the circuit 200 becomes the voltage Vdd of the second digital device (modem) connected to the interface node 230.

Thus, the circuit 200 forms a logic interface that can operate at Vcc2 (3.3 volts, in this example) in a standard way, with the Vdd pin providing a reference voltage as an output. Also, the circuit 200 can operate with the Vdd pin as an input to accommodate external devices that need a different logic level. This flexibility is gained by exploiting a normally unused characteristic of bipolar transistors, such as transistor 214, operation in cut-off mode. Also, interface circuit operation is automatic and requires no user input or smart software in a microcontroller. Simply connecting the external digital device to the circuit 200 is adequate to provide proper voltage interaction.

The circuit 200 of FIG. 2 requires current in the low milliampere range to flow from Vcc 1 to Vcc 2. This requirement is met so long as there is sufficient load at Vcc 2. In a digital device with good power management, the load or current drain at Vcc 2 might be much less than one milliamp. In this instance, the voltage drop across the diode 210 will not be adequate to match the base-emitter junction potential of the transistor 214.

Figure 3:
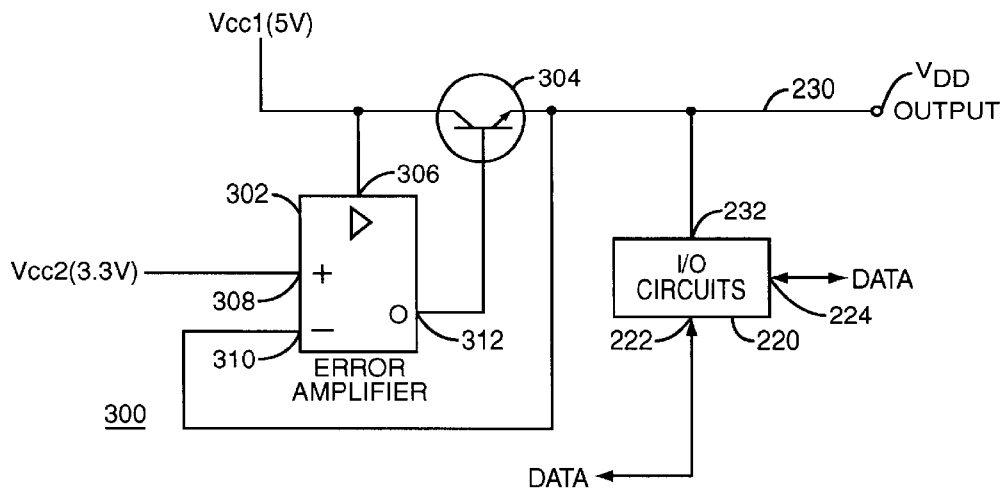
FIG. 3 is a second circuit in accordance with the present invention for communicating data among digital devices.

FIG. 3 shows an alternative embodiment of a voltage tolerant regulator circuit 300 for communicating digital data among digital devices having different operating voltages. The circuit 300 includes an error amplifier 302 and a pass transistor 304.

The error amplifier 302 may be configured from any suitable operational amplifier, preferably a monolithic integrated circuit. The error amplifier 302 has an input 306 for receiving an operating voltage. In the illustrated embodiment, input 306 is coupled to Vcc1 which is set at 5 volts. The error amplifier 302 further includes differential inputs 308 and 310. Vcc2 is coupled to input 308 and in the exemplary embodiment of FIG. 3 is set at 3.3 volts. The error amplifier 302 further includes an output 312 which is coupled to the base of the pass transistor 304. The pass transistor 304 has a collector coupled to Vcc1 and an emitter coupled to the interface node 230.

The error amplifier 302 operates to minimize the difference between the voltages at input 308 and input 310. Thus, if the voltage on the interface node 230 varies from Vcc 2, the error amplifier 302 counteracts this variation and reduces the error to substantially zero. The pass transistor 304 is configured as an emitter follower to provide adequate drive current to the interface node 230.

In alternative embodiments, the reference potential provided to the input 308 could be provided using a Zener diode or some other voltage reference device. However, the embodiment illustrated in FIG. 3 may be preferable. For example, if Vcc2 is available from a voltage regulator or other source to power other portions of the digital device, providing Vcc2 to the input 308 is less expensive than providing a Zener diode.

When a voltage greater than Vcc2 is applied to the output, the error amplifier detects the over-voltage condition at the input 310. In response, the error amplifier 302 reduces the voltage applied at the base of the pass transistor 304, turning off that transistor. Thus, the pass transistor is maintained in cut-off mode when the voltage applied at Vdd exceeds Vcc2. Any suitable voltage regulator or operational amplifier may be used to perform the function of the error amplifier 302. Other types of voltage regulator circuits can also be designed to perform functions similar to that of the circuit 300.

Figure 4:
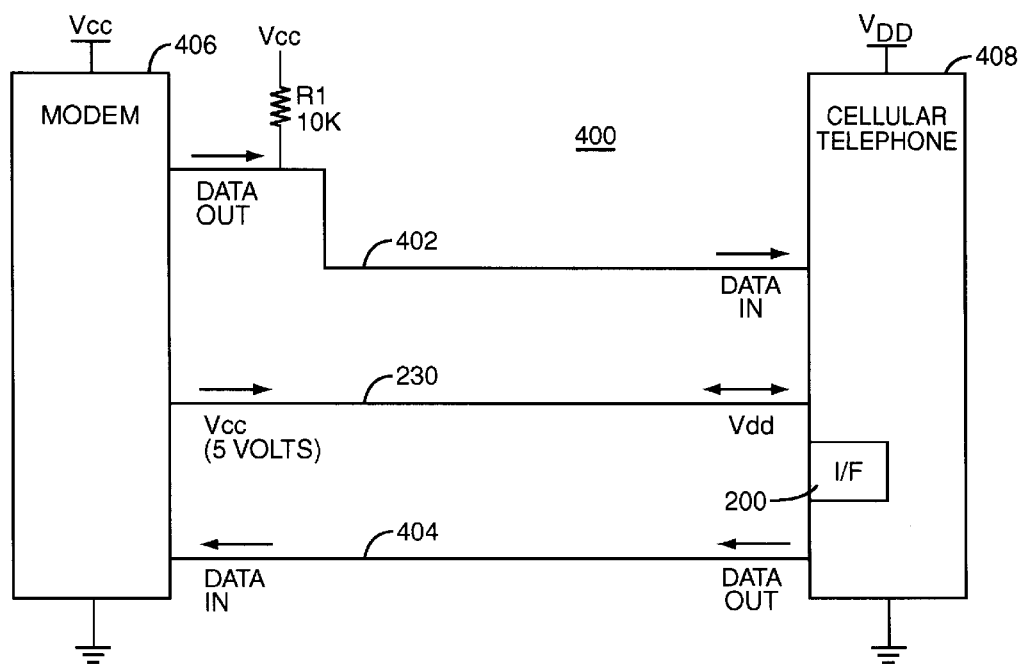
FIG. 4 illustrates a circuit in accordance with the present invention for communicating data among digital devices.

FIG. 4 shows a circuit diagram of a circuit 400 for communicating data among digital devices, at least one of which employs a voltage tolerant regulator circuit as illustrated, for example, in FIG. 2 or FIG. 3. The circuit may be implemented, for example, as a cable for connecting a cellular telephone 408 with a cellular modem 408. The circuit includes only a first data line 402, a second data line 404 and the interface node 230. The first data line 402 conveys digital data from a first digital device, cellular telephone 408 to a second digital device, cellular modem 406. In the illustrated embodiment, the cellular modem 406 is a modem powered by a voltage Vcc which is typically 5 volts. Further, in FIG. 4, the cellular telephone 408 is powered by a voltage Vdd which is typically 3.3 volts. The interface node 230 provides to the first digital device 408 an indication of the operating voltage used by the second digital device 406. If the operating voltage, Vcc, of the second digital device exceeds the operating voltage, Vdd, of the first digital device, Vcc will be employed to power the input/output circuit of the cellular telephone 408 so that input/output circuits of both digital devices will use binary voltage levels referenced to a common supply voltage.

Figure 5:
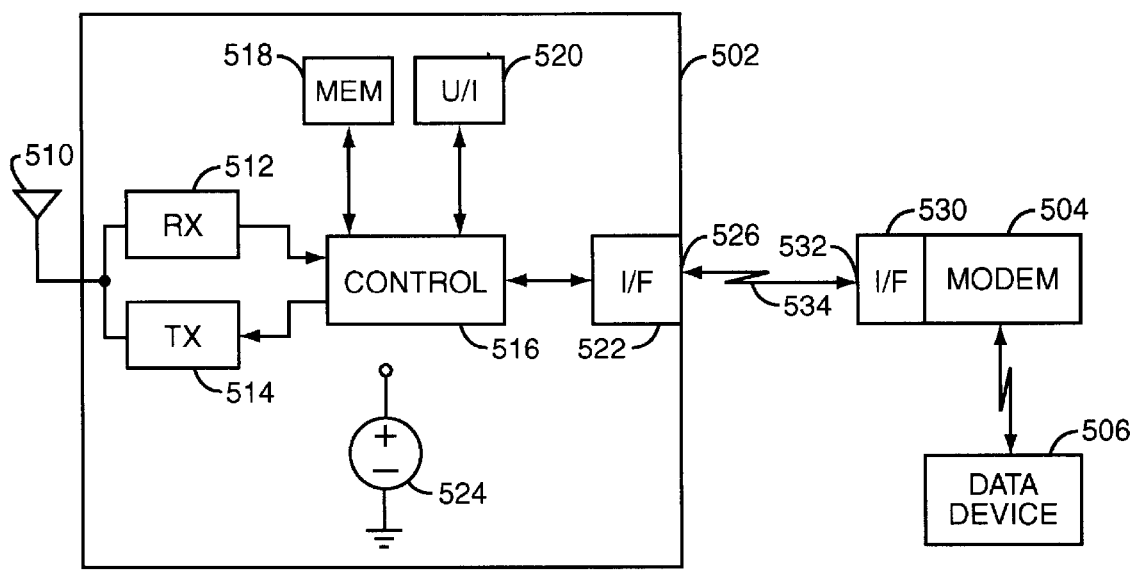
FIG. 5 is a block diagram illustrating a communication device in accordance with the present invention.

Referring now to FIG. 5, it shows a communication device in accordance with the present invention. The communication device 500 includes a radiotelephone 502 and a modem 504. The modem is in electronic communication with a data device 506 which may be, for example, a personal computer, a personal digital assistant or any other source of digital data.

The radiotelephone 502 includes an antenna 510, a receive circuit 512, a transmit circuit 514, a controller 516, a memory 518, a user interface 520 and a data interface 522. The radiotelephone 502 is powered by a battery 524.

The radiotelephone is configured for radio communication with a remote radio source. Radio signals are received at the antenna 510 and converted to digital data by the receiver 512. Digital data are provided to the controller 516. For transmission of information, the controller 516 provides digital data to the transmitter 514. The transmitter converts digital data to radio signals for transmission from the antenna 510. Thus, the receiver 512 and the transmitter 514 form radio circuitry for radio frequency communication with a remote radio device. The memory 518 stores digital data and programs of instruction for operating the controller 516, which controls operation of the radiotelephone 502. The user interface 520 allows user control and interaction with the radiotelephone 502. For example, the user interface 520 may include a key pad, a display, a microphone and a speaker. The data interface 522 communicates digital data with other digital devices coupled to a port 526.

The modem 504 is a modulator/demodulator which encodes and decodes data for communication between the data device 506 and the radiotelephone 502. The modem includes an interface 530 which has a port 532 coupled to the port 526 of the radiotelephone 502. A cable 534 couples the modem 504 and the radiotelephone 502.

In the illustrated embodiment, the data interface 522 includes a data circuit for communicating digital data with a detachable modem circuit, modem 504. The data circuit of the data interface 522 may be any suitable digital I/O circuit and is responsive to a supply voltage on an interface node of the cable 534 for providing output digital signals to the modem and receiving input digital signals from the modem. The input digital signals and the output digital signals are at voltage levels suitable for communication between the modem and the data interface 522. The data interface 522 further includes a voltage regulator circuit such as the circuit 200 of FIG. 2 or the circuit 300 of FIG. 3. The voltage regulator circuit forms an interface circuit coupled to the interface node of the cable 534 and configured to provide the supply voltage from the radiotelephone 502 to match the output digital signals to logic voltages used by logic circuits of the modem 504.

From the foregoing, it can be seen that the present invention provides a method and apparatus for communicating digital data among digital devices having different operating voltages. A first digital device generates a supply voltage and varies the supply voltage to match a logic voltage used by logic circuits at a second digital device. In one embodiment, the supply voltage is provided at an interface node which is common between the two digital devices. When a second supply voltage at the interface node exceeds the supply voltage, the first digital device interrupts its supply of the supply voltage. In this manner, input/output circuits of both digital devices communicate using a common supply voltage so that their binary voltage levels match.

While a particular embodiment of the present invention has been shown and described, modifications may be made. For example, in the illustrated embodiment, a cellular telephone communicates with a cellular modem. However, the technique and apparatus illustrated may be modified for use with any digital devices that must communicate digital data. It is therefore intended in the appended claims to cover all such changes and modifications which falls within the true spirit and scope of the invention.

What is claimed is:

1. A method for electrically coupling digital devices, the method comprising the steps of:

generating a first voltage at a first digital device and providing said first voltage at an interface node coupled to a second digital device, said first and second digital devices operating at a common ground level; and varying the first voltage to match a second voltage used by logic circuits at said second digital device in communication with the first digital device when said second voltage exceeds said first voltage.

2. The method of claim 1 wherein varying the first device supply voltage comprises the step of providing the supply voltage at an interface node coupled to the second digital device until a second device supply voltage at the interface node exceeds the supply voltage.

3. The method of claim 2 further comprising the steps of operating data circuits at the first digital device for data interchange with the second digital device in response to the greater of the first device supply voltage and the second device supply voltage.

4. The method of claim 3 further comprising the steps of:

producing logic levels at the data circuits at the first digital device; and varying the logic levels in response to varying the first device supply voltage.

5. The method of claim 1 further comprising the step of communicating digital data using digital signals between the first digital device and the second digital device.

6. The method of claim 5 wherein communicating digital data comprises, at the first digital device, developing voltages corresponding to digital logic levels in response to the first device supply voltage.

7. Apparatus for electrically coupling a first digital device and a second digital device, the apparatus comprising:

an interface circuit at the first digital device coupled at an interface node to the second digital device, the interface circuit configured to provide a first device supply voltage to the interface node until a second device supply voltage at the interface node exceeds the first device supply voltage, said first and second digital devices at a common ground; and a data circuit at the first digital device coupled to the interface node, the data circuit responsive to voltage on the interface node for providing digital logic signals at appropriate voltage levels to the second digital device.

8. The apparatus of claim 7 wherein the data circuit provides the appropriate voltage levels in response to the higher of the first device supply voltage and the second device supply voltage.

9. The apparatus of claim 7 wherein the interface circuit is inactivated when the second device supply voltage exceeds the first device supply voltage.

10. The apparatus of claim 9 wherein the interface circuit includes a transistor coupled to the interface node for providing drive current to the interface node at the first device supply voltage, the transistor being substantially turned off when the second device supply voltage at the interface node exceeds the first device supply voltage.

11. A data interchange method for exchanging digital data between two or more digital devices requiring differing operating voltages, the method comprising the steps of:

at a first digital device, providing to data circuits a supply voltage substantially equal to a first operating voltage of the first digital device, the data circuits being configured for exchanging data with a second digital device, said first and second digital devices at a common ground; and when the second digital device requires a second operating voltage greater than the first operating voltage, providing the second operating voltage to the data circuits so the data circuits send and receive voltage levels suitable for communication with the second digital device.

12. The data interchange method of claim 11 further comprising the steps of:

coupling the first digital device and the second digital device over a common interface node;

powering the data circuits from a voltage on the interface node;

at the data circuits, developing the voltage levels for communication with the second digital device in response to the voltage on the interface node; and providing the first operating voltage to the interface node from the first digital device until the second operating voltage on the interface node from the second digital device exceeds the first operating voltage.

* * * * *